(12) United States Patent
Akyol et al.

(10) Patent No.: US 9,372,495 B2
(45) Date of Patent: *Jun. 21, 2016

(54) DB-LINEAR VOLTAGE-TO-CURRENT CONVERTER

(71) Applicant: Skyworks Solutions, Inc., Woburn, MA (US)

(72) Inventors: Hasan Akyol, Mountain View, CA (US); Bipul Agarwal, Irvine, CA (US); Dean Badillo, Schaumburg, IL (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/806,336

(22) Filed: Jul. 22, 2015

(65) Prior Publication Data

US 2016/0018838 A1 Jan. 21, 2016

Related U.S. Application Data

(63) Continuation of application No. 13/281,668, filed on Oct. 26, 2011, now Pat. No. 9,124,230, which is a continuation of application No. 12/363,849, filed on Feb. 2, 2009, now Pat. No. 8,072,245.

(51) Int. Cl.
*H02M 11/00* (2006.01)
*H03F 3/45* (2006.01)
(Continued)

(52) U.S. Cl.
CPC .............. *G05F 3/262* (2013.01); *H03F 1/301* (2013.01); *H03F 3/16* (2013.01); *H03F 3/45183* (2013.01);
(Continued)

(58) Field of Classification Search
CPC ....... G05F 1/561; G05F 3/262; H03F 1/3211; H03F 3/45475; H03F 3/45179
USPC .................................. 327/103; 323/312–314
See application file for complete search history.

(56) References Cited

U.S. PATENT DOCUMENTS 5,402,061 A 3/1995 Marsh et al.
5,777,507 A 7/1998 Kaminishi et al.
(Continued)

OTHER PUBLICATIONS

Chi-Hung Lin, et al., "Universal Exponential Function Implementation using Highly-Linear CMOS V-I Converters for dB-linear (AGC) Applications," Circuits and Systems, 1998, Proceedings, Midwest Symposium on Volume, Issue, Aug. 9-12, 1998, pp. 360-363.

(Continued)

*Primary Examiner* — Lincoln Donovan
*Assistant Examiner* — Diana J Cheng
(74) *Attorney, Agent, or Firm* — Knobbe, Martens, Olson & Bear, LLP (57) ABSTRACT

A dB-linear voltage-to-current (V/I) converter is amenable to implementation in CMOS technology. In a representative embodiment, the dB-linear V/I converter has a voltage scaler, a current multiplier, and an exponential current converter serially connected to one another. The voltage scaler supplies an input current to the current multiplier based on an input voltage. The current multiplier multiplies the input current and a current proportional to absolute temperature and supplies the resulting current to the exponential current converter. The exponential current converter has a differential MOSFET pair operating in a sub-threshold mode and generating an output current that is proportional to a temperature-independent, exponential function of the input voltage.

20 Claims, 4 Drawing Sheets (51) Int. Cl.
   *G05F 3/26* (2006.01)
   *H03F 1/30* (2006.01)
   *H03F 3/16* (2006.01)

(52) U.S. Cl.
   CPC ...... *H03F 3/45475* (2013.01); *H03F 2200/447* (2013.01); *H03F 2203/45528* (2013.01); *H03F 2203/45591* (2013.01); *H03F 2203/45594* (2013.01); *H03F 2203/45646* (2013.01)

(56) References Cited

U.S. PATENT DOCUMENTS

| | | |
|---|---|---|
| 6,124,761 A | 9/2000 | Robinson et al. |
| 6,369,618 B1 | 4/2002 | Bloodworth et al. |
| 7,196,555 B2 | 3/2007 | Taylor |
| 7,333,782 B2 | 2/2008 | Kim |
| 8,072,245 B2 | 12/2011 | Akyol et al. |
| 9,124,230 B2 | 9/2015 | Akyol et al. |
| 2008/0284493 A1 | 11/2008 | Baek et al. |
| 2008/0297093 A1 | 12/2008 | Wimmer et al. |

OTHER PUBLICATIONS

Manoj Bikumandla, et al., "Biasing CMOS Amplifiers Using MOS Transistors in Subthreshold Region," 2004, IEIC Electronics Express, vol. 1, No. 12, pp. 339-345.

Quoc-Hoang Duong, et al., "Ultra Low-Voltage and Low-Power dB-linear V-I Converter Using Composite NMOS Transistors," 2003, IEEE Conference on Volume, Dec. 2003, pp. 101-104.

Shen-Iuan Liu, et al., "CMOS Subthreshold Four-Quadrant Multiplier Based on Unbalanced Source-Coupled Pairs," International Journal of Electronics, vol. 78, No. 2, Feb. 1995, pp. 327-332.

DB-LINEAR VOLTAGE-TO-CURRENT CONVERTER

Any and all applications for which a foreign or domestic priority claim is identified in the Application Data Sheet as filed with the present application are hereby incorporated by reference under 37 CFR 1.57.

BACKGROUND

1. Field of the Invention

The present invention relates to electronics and, more specifically, to voltage-to-current (V/I) converters having an exponential transfer function.

2. Description of the Related Art

This section introduces aspects that may help facilitate a better understanding of the invention(s). Accordingly, the statements of this section are to be read in this light and are not to be understood as admissions about what is in the prior art or what is not in the prior art.

Figure 6:
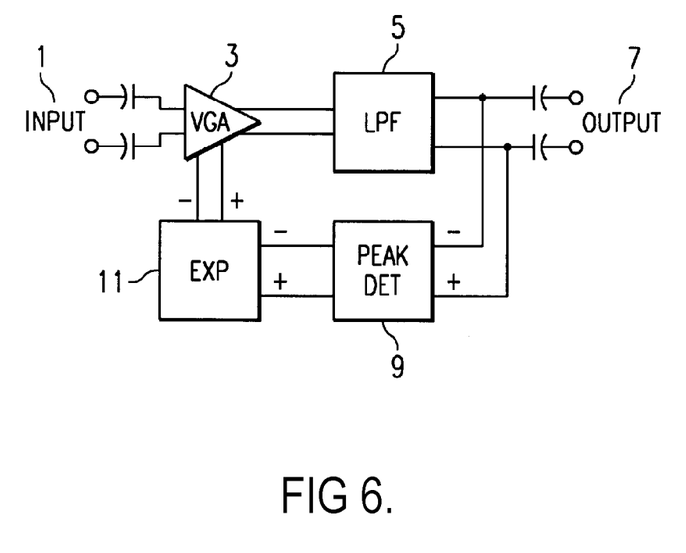
FIG. 6 is a block diagram of a typical AGC circuit.

An exponential (or dB-linear) voltage-to-current (V/I) converter is a key component for the design of automatic gain-control (AGC) circuits, which are used in a variety of applications, such as wireless communications devices, hearing aids, and disk drives. A representative AGC circuit employs an exponential V/I converter in the feedback loop that controls the gain of a variable-gain amplifier (VGA). The basic form of an AGC loop, as shown in FIG. 6, consists of an alternating current (a. c.) coupled input 1 followed by a variable gain amplifier (VGA) 3 which drives a low pass filter 5 followed by an a. c. coupled output 7 to subsequent circuitry, with a feedback loop from the output 7 of the low pass filter through a peak detector 9 to an exponential voltage-to-current converter 11. Converter 11 provides as output a control signal that controls the gain of the VGA 3. The exponential characteristic of the V/I converter enables the AGC circuit to advantageously have a substantially constant settling time for a variety of initial input-signal conditions, which is very desirable for the above-specified applications. Additional details on the use of exponential V/I converters in AGC circuits can be found, e.g., in U.S. Pat. No. 6,369,618, which is incorporated herein by reference in its entirety.

One problem with exponential V/I converters is that they are not straightforwardly amenable to implementation in CMOS technology. More specifically, unlike bipolar transistors, which have an inherent exponential transfer characteristic, MOSFET transistors have a square-law transfer characteristic in strong inversion. As a result, designing a CMOS V/I converter that exhibits an exponential transfer characteristic and has other desirable properties is relatively difficult.

SUMMARY

Problems in the prior art are addressed by various embodiments of an exponential (or dB-linear) voltage-to-current (V/I) converter that is amenable to implementation in CMOS technology. In a representative embodiment, the exponential V/I converter has a voltage scaler, a current multiplier, and an exponential current converter serially connected to one another. The voltage scaler supplies an input current to the current multiplier based on an input voltage. The current multiplier multiplies the input current and a current proportional to absolute temperature and supplies the resulting current to the exponential current converter. The exponential current converter has a differential MOSFET pair operating in a sub-threshold mode and generating an output current that is proportional to a temperature-independent, exponential function of the input voltage. Advantageously, the exponential V/I converter can be implemented to have a dB-linear operation range as wide as about 40 dB.

According to one embodiment, provided is a device having (A) a current multiplier that multiplies a first current and a current proportional to absolute temperature to generate a second current; and (B) an exponential converter that applies an exponential transfer function to the second current to generate an output current. The exponential transfer function depends on a thermal voltage. Temperature dependence of the current proportional to absolute temperature counteracts temperature dependence of the thermal voltage to cause the output current to be proportional to a temperature-independent, exponential function of the first current over an operating range of the device.

According to another embodiment, provided is a method having the steps of: (A) multiplying a first current and a current proportional to absolute temperature to generate a second current; and (B) applying an exponential transfer function to the second current to generate an output current. The exponential transfer function depends on a thermal voltage. Temperature dependence of the current proportional to absolute temperature counteracts temperature dependence of the thermal voltage to cause the output current to be proportional to a temperature-independent, exponential function of the first current over a specified operating range.

According to yet another embodiment, provided is a device having (A) means for multiplying a first current and a current proportional to absolute temperature to generate a second current; and (B) means for applying an exponential transfer function to the second current to generate an output current. The exponential transfer function depends on a thermal voltage. Temperature dependence of the current proportional to absolute temperature counteracts temperature dependence of the thermal voltage to cause the output current to be proportional to a temperature-independent, exponential function of the first current over an operating range of the device.

BRIEF DESCRIPTION OF THE DRAWINGS

Other aspects, features, and benefits of the present invention will become more fully apparent from the following detailed description, the appended claims, and the accompanying drawings in which:

DETAILED DESCRIPTION OF THE PREFERRED EMBODIMENT

Figure 1:
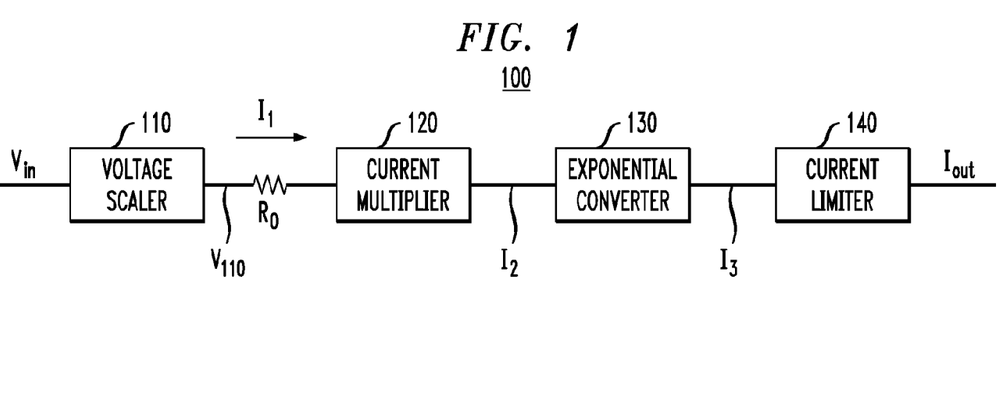
FIG. 1 shows a block diagram of an exponential (or dB-linear) voltage-to-current (V/I) converter according to one embodiment of the invention.

FIG. 1 shows a block diagram of an exponential (or dB-linear) voltage-to-current (V/I) converter 100 according to one embodiment of the invention. Converter 100 receives input voltage $V_{in}$ and converts it into output current $I_{out}$ so that there is an exponential relationship between the input voltage and the output current. As further described below, converter 100 is amenable to implementation in CMOS technology and is advantageously capable of maintaining the exponential transfer characteristic over a relatively wide (e.g., about 40 dB) output-current range.

Converter 100 has a voltage scaler 110 that conditions input voltage $V_{in}$ for further processing in the subsequent circuit blocks of the converter. More specifically, voltage scaler 110 scales input voltage $V_{in}$ and adds bias voltage $V_{bias}$ to the scaled voltage according to Eq. (1):

$$V_{110} = V_{bias} + \gamma V_{in} \quad (1)$$

where $V_{110}$ is the output voltage of the voltage scaler, and $\gamma$ is a scaling factor. In one embodiment, one or both of bias voltage $V_{bias}$ and scaling factor $\gamma$ are programmable so that output voltage $V_{110}$ remains in an optimal range for the entire variability range of input voltage $V_{in}$. In a representative embodiment, $|V_{bias}| \approx 0.2V$ and $\gamma \approx 0.5$.

Converter 100 applies output voltage $V_{110}$ to resistive load $R_0$, which drives current $I_1$ through that load. In effect, the combination of voltage scaler 110 and resistive load $R_0$ serves as a voltage-to-current converter that converts input voltage $V_{in}$ into current $I_1$. The subsequent signal processing in converter 100 is current-based and converts current $I_1$ into output current $I_{out}$.

Converter 100 further has a current multiplier 120 whose output current $I_2$ is expressed according to Eq. (2):

$$I_2 = \eta I_1 I_{PTAT} \quad (2)$$

where $\eta$ is a constant, and $I_{PTAT}$ is a current proportional to absolute temperature (PTAT). In effect, current multiplier 120 generates output current $I_2$ by multiplying the input current (i.e., current $I_1$) and current $I_{PTAT}$. As further described below, the temperature proportionality of current $I_{PTAT}$ is utilized to make the exponential transfer characteristic of converter 100 substantially temperature independent and enable the converter to operate accurately and reliably in a variety of ambient conditions without a thermostat.

Output current $I_2$ produced by current multiplier 120 is applied to an exponential current converter 130 that converts output current $I_2$ into output current $I_3$ according to Eq. (3):

$$I_3 = A \exp(\sigma I_2 / V_T) \quad (3)$$

where $A$ and $\sigma$ are constants, and $V_T$ is the thermal voltage ($= k_B T/q$, where $k_B$ is the Boltzmann constant, $T$ is temperature in Kelvin, and $q$ is the electron charge). Eqs. (2) and (3), taken together, indicate that current multiplier 120 and exponential current converter 130 work together to provide a substantially temperature-independent, exponential transfer function between currents $I_1$ and $I_3$. More specifically, according to Eqs. (2) and (3), the argument of the exponent in Eq. (3) contains current $I_{PTAT}$ and thermal voltage $V_T$ in the nominator and denominator, respectively. Since both current $I_{PTAT}$ and thermal voltage $V_T$ are linear functions of temperature, their temperature dependencies cancel each other, thereby causing the exponential transfer function between currents $I_1$ and $I_3$ to be substantially temperature independent.

Exponential current converter 130 applies output current $I_3$ to a current limiter 140, where it is processed to generate output current $I_{out}$. More specifically, current limiter 140 imposes lower limit $I_{min}$ and upper limit $I_{max}$ onto current $I_3$. If the magnitude of current $I_3$ is smaller than lower limit $I_{min}$, then current limiter 140 forces $I_{out} \geq I_{min}$. If the magnitude of current $I_3$ is larger than upper limit $I_{max}$, then current limiter 140 forces $I_{out} \approx I_{max}$. If the magnitude of current $I_3$ is between lower limit $I_{min}$ and upper limit $I_{max}$, then current limiter 140 forces $I_{out} \approx I_3$.

Figure 2:
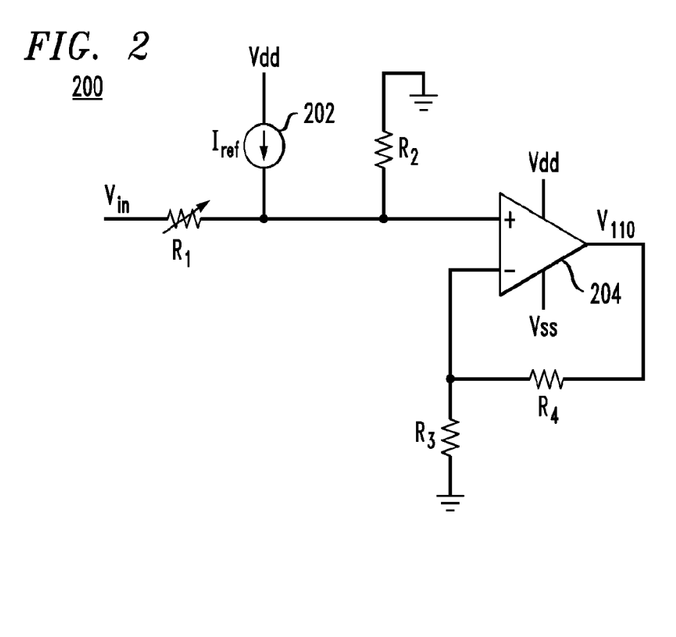
FIG. 2 shows a circuit diagram of a voltage scaler that can be used in the exponential V/I converter of FIG. 1 according to one embodiment of the invention.

FIG. 2 shows a circuit diagram of a voltage scaler 200 that can be used as voltage scaler 110 according to one embodiment of the invention. Voltage scaler 200 has a reference current source 202, an operational amplifier 204, and four resistors $R_1$-$R_4$ interconnected as shown in FIG. 2. If $R_1 \gg R_2$, then voltage scaler 200 implements the transfer function defined by Eq. (1), wherein:

$$V_{bias} \approx I_{ref} \frac{R_2(R_3 + R_4)}{R_3} \quad (4a)$$

$$\gamma \approx \frac{R_2(R_3 + R_4)}{R_1 R_3} \quad (4b)$$

where $I_{ref}$ is the current generated by reference current source 202. Note that resistor $R_1$ is a programmably variable resistor, which enables programmability of scaling factor $\gamma$. In one embodiment, reference current source 202 is a programmably variable current source, which enables programmability of bias voltage $V_{bias}$.

Figure 3:
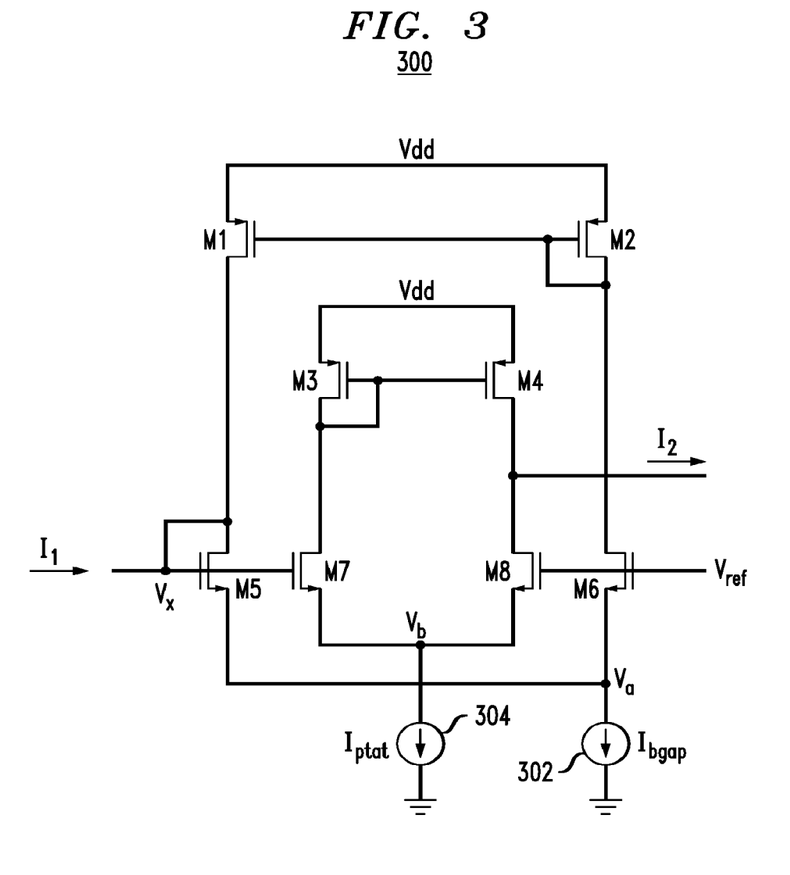
FIG. 3 shows a circuit diagram of a current multiplier that can be used in the exponential V/I converter of FIG. 1 according to one embodiment of the invention.

FIG. 3 shows a circuit diagram of a current multiplier 300 that can be used as current multiplier 120 according to one embodiment of the invention. Current multiplier 300 has two nested differential amplifiers, each having an active current-mirror load. The active devices of the first (outer) differential amplifier are MOSFET transistors M5 and M6, and the load of that differential amplifier is the current mirror formed by transistors MOSFET M1 and M2. Similarly, the active devices of the second (inner) differential amplifier are transistors MOSFET M7 and M8, and the load of that differential amplifier is the current mirror formed by MOSFET transistors M3 and M4. The gates of transistors M5 and M7 are both electrically connected to a common node having floating voltage $V_x$. The gates of transistors M6 and M8 are both electrically connected to a common node that receives reference voltage $V_{ref}$.

In one embodiment, reference voltage $V_{ref}$ is supplied by a programmable reference-voltage source (not explicitly shown in FIG. 3). The voltage source is programmed to set a value of $V_{ref}$ so that there is a desired relationship between output current $I_2$ and input voltage $V_{in}$. In particular, $V_{ref}$ is selected from a voltage range, wherein, if $V_{ref}$ changes, then the transfer function between output current $I_2$ and input voltage $V_{in}$ is translated along the voltage axis without changing its slope.

Current multiplier 300 further has reference current sources 302 and 304 that function as tail supplies of the outer and inner differential amplifiers, respectively. Current source 302 is designed to generate reference current $I_{bgap}$ that does not depend on the technological process used in the fabrication of current multiplier 300 or on the temperature of the current multiplier. In one embodiment, current source 302 can be implemented, as known in the art, using a conventional bandgap circuit. Current source 304 is designed to generate temperature-dependent PTAT current $I_{PTAT}$ (see also Eq. (2)). In one embodiment, current source 304 can be a PTAT current source disclosed, e.g., in U.S. Patent Application Publication No. 2008/0284493, which is incorporated herein by reference in its entirety. In one configuration, current source 304 generates current $I_{PTAT}$ so that, at room temperature ($T_0 = 298$ K), $I_{PTAT} = I_{bgap}$.

Operation of transistors M5-M8 in current multiplier 300 is described by Eqs. (5a)-(5d), respectively:

$$\frac{I_{bgap} + I_1}{2} = \frac{1}{2}\mu_n C_{ox} \frac{W_1}{l_1}(V_x - V_a - V_{th})^2 \quad (5a)$$

$$\frac{I_{PTAT} + I_2}{2} = \frac{1}{2}\mu_n C_{ox} \frac{W_2}{l_2}(V_x - V_b - V_{th})^2 \quad (5b)$$

$$\frac{I_{bgap} - I_1}{2} = \frac{1}{2}\mu_n C_{ox} \frac{W_1}{l_1}(V_{ref} - V_a - V_{th})^2 \quad (5c)$$

$$\frac{I_{PTAT} - I_2}{2} = \frac{1}{2}\mu_n C_{ox} \frac{W_2}{l_2}(V_{ref} - V_b - V_{th})^2 \quad (5d)$$

where $\mu_n$ is the mobility of electrons; $C_{ox}$ is the capacitance of the oxide layer; $W_1$ and $l_1$ are the width and length, respectively, of transistors M5 and M6; $W_2$ and $l_2$ are the width and length, respectively, of transistors M7 and M8; $V_a$ and $V_b$ are the voltages indicated in FIG. 3; and $V_{th}$ is the threshold voltage. If transistors M5-M8 are implemented so that $$\frac{(W_1/l_1)}{(W_2/l_2)} = 1,$$

then $V_x = V_{ref}$ and Eqs. (5a)-(5d) reduce to Eq. (2), wherein $n = (I_{bgap})^{-1}$.

If current multiplier 300 is used in V/I converter 100 to implement current multiplier 120, then the following relationship exists between input voltage $V_{in}$ and current $I_1$:

$$I_1 = \alpha V_{in} + i_c \quad (6)$$

where $\alpha = \gamma/R_0$ and $i_c = (V_{bias} - V_{ref})/R_0$. Note that, for a given configuration of V/I converter 100, $\alpha$ and $i_c$ are constants.

Figure 4:
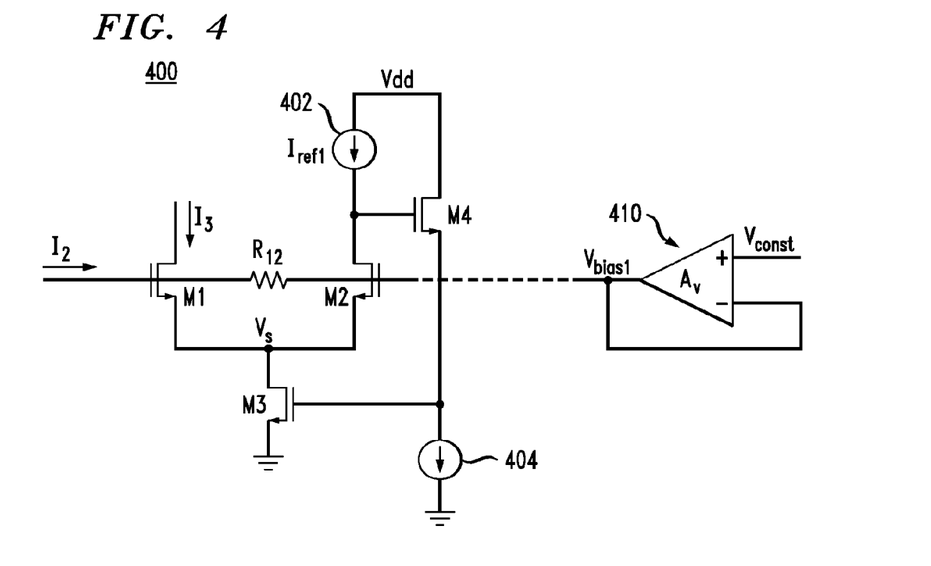
FIG. 4 shows a circuit diagram of an exponential current converter that can be used in the exponential V/I converter of FIG. 1 according to one embodiment of the invention.

FIG. 4 shows a circuit diagram of an exponential current converter 400 that can be used as exponential current converter 130 according to one embodiment of the invention. Exponential current converter 400 has a differential pair of MOSFET transistors M1 and M2 that are configured to operate in a sub-threshold mode (also referred to as a cut-off or weak-inversion mode). The gates of transistors M1 and M2 are electrically connected through resistor $R_{12}$. The gate of transistor M2 receives bias voltage $V_{bias1}$ from a bias-voltage generator 410. Transistor M3 serves as a tail supply for the differential pair. A current source 402 drives reference current $I_{ref1}$ through transistor M2. A current source 404 and transistor M4 are used to appropriately bias transistors M2 and M3.

As known in the art, drain-to-source current $I_{ds}$ in a MOSFET transistor operating in a sub-threshold mode varies exponentially with gate-to-source voltage $V_{gs}$, as expressed by Eq. (7):

$$I_{ds} \approx I_0 \exp\left(\frac{V_{gs} - V_{th}}{nV_T}\right) \quad (7)$$

where $I_0$ is a constant; and $n = 1 + C_D/C_{ox}$, where $C_D$ is the capacitance of the depletion layer. Applying Eq. (7) to transistor M2, one finds that:

$$I_{ref1} \approx I_0 \exp\left(\frac{V_{bias1} - V_s - V_{th}}{nV_T}\right) \quad (8)$$

where $V_s$ is the voltage indicated in FIG. 4. Further applying Eq. (7) to transistor M1 and then using Eq. (8), one finds that:

$$I_3 \approx I_0 \exp\left(\frac{V_{bias1} + I_2 R_{12} - V_s - V_{th}}{nV_T}\right) = I_{ref1} \exp\left(\frac{I_2 R_{12}}{nV_T}\right) \quad (9)$$

Note that Eq. (9) is equivalent to Eq. (3), wherein $A = I_{ref1}$ and $\sigma = R_{12}/n$.

If current multiplier 300 and exponential current converter 400 are used in V/I converter 100 to implement current multiplier 120 and exponential converter 130, respectively, then the following relationship exists between input voltage $V_{in}$ and current $I_3$:

$$I_3 = B \exp(\beta V_{in}) \quad (10)$$

where $$B = I_{ref1} \exp\left(\frac{R_{12} I_{PTAT} i_c}{nV_T I_{bgap}}\right) \text{ and } \beta = \frac{\alpha R_{12} I_{PTAT}}{nV_T I_{bgap}}.$$

Note that, for a given configuration of V/I converter 100, B and $\beta$ are constants that do not depend on the temperature because the temperature dependencies of current $I_{PTAT}$ and thermal voltage $V_T$ substantially cancel each other. Thus, Eq. (10) indicates that V/I converter 100 employing current multiplier 300 and exponential current converter 400 provides a temperature-independent, exponential transfer function between input voltage $V_{in}$ and current $I_3$. In addition, current multiplier 300 and exponential current converter 400 are advantageously capable of exhibiting a dB-linear transfer function over a relatively wide (e.g., about 40 dB) operation range because the exponential current converter invokes the inherent exponential characteristic of MOSFET transistors in the sub-threshold operating mode.

Figure 5:
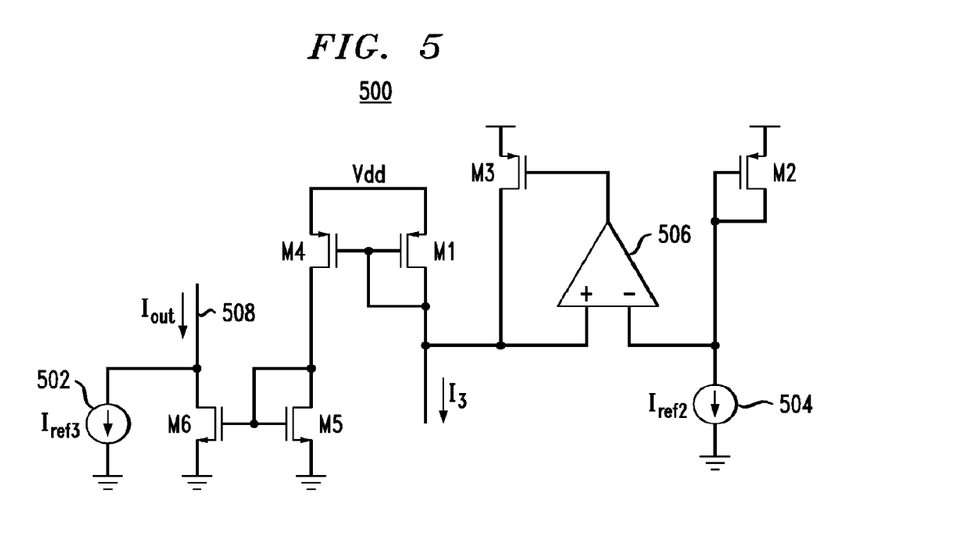
FIG. 5 shows a circuit diagram of a current limiter that can be used in the exponential V/I converter of FIG. 1 according to one embodiment of the invention.

FIG. 5 shows a circuit diagram of a current limiter 500 that can be used as current limiter 140 according to one embodiment of the invention. Current limiter 500 has reference current sources 502 and 504, an operational amplifier 506 with a feedback network, and two current mirrors formed by transistors M1, M4, M5, and M6. Reference current $I_{ref3}$ generated by current source 502 sets the minimum output current for current limiter 500. Reference current $I_{ref2}$ generated by current source 504 sets the maximum output current for current limiter 500.

Current source 502 sets the minimum output current for current limiter 500 because it is directly connected to an output terminal 508 of the current limiter. As a result, output current $I_{out}$ has at least a current component corresponding to reference current $I_{ref3}$. Hence, output current $I_{out}$ does not drop below the value of $I_{ref3}$ even if current $I_3$ becomes zero.

Current source 504 sets the maximum output current for current limiter 500 in the following manner. Transistors M1 and M2 have substantially the same size, which causes the value of $I_{ref2}$ to set the ON/OFF level for transistor M3. More specifically, if current $I_3$ is smaller than $I_{ref2}$, then operational amplifier 506 holds transistor M3 in the OFF state. As a result, the two current mirrors formed by transistors M1, M4, M5, and M6 force output current $I_{out}$ to mirror current $I_3$. However, if current $I_3$ is greater than $I_{ref2}$, then operational amplifier 506 turns ON transistor M3, which sinks the excess current and causes the current flowing through transistor M1 to remain at the value of $I_{ref2}$. The two current mirrors then mirror the current flowing through transistor M1 onto output terminal 508, thereby substantially forcing output current $I_{out}$ not to exceed the value of $I_{ref3}$.

While this invention has been described with reference to illustrative embodiments, this description is not intended to be construed in a limiting sense. Although certain embodiments of the invention have been described in reference to NMOS technology, the invention is not so limited. Various circuits of the inventions can also be implemented using the PMOS technology, the bipolar CMOS technology, and various non-MOS technologies, including implementations in an integrated circuit. Various modifications of the described embodiments, as well as other embodiments of the invention, which are apparent to persons skilled in the art to which the invention pertains are deemed to lie within the principle and scope of the invention as expressed in the following claims.

As used herein, the term dB-linear means that, when plotted on a logarithmic scale over an operation range, the output current is a substantially linear function of the input voltage (or current), wherein slope of the linear function does not deviate from a specified value by more than about ±5%.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

As used in the claims, the terms "source," "drain," and "gate" should be understood to refer either to the source, drain, and gate of a MOSFET or to the emitter, collector, and base of a bi-polar device when the present invention is implemented using bi-polar transistor technology.

What is claimed is:

1. A current limiter comprising:
   a first reference-current source directly coupled to an output terminal, the first reference-current source configured to generate a first reference current;
   an amplifier having a first input, a second input, and an amplifier output, the second input and the amplifier output electrically connected via a feedback loop, the second input configured to receive an input current;
   a second reference-current source electrically coupled to the first input of the amplifier, the second reference-current source configured to generate a second reference current; and
   first and second current mirrors electrically coupled between the second input of the amplifier and the output terminal, the output terminal outputting a limited current such that the first reference current sets a lower limit and the second reference current sets an upper limit.

2. The current limiter of claim 1 wherein the limited current is substantially the same as the input current when the input current is between the first and second reference currents.

3. The current limiter of claim 1 wherein the limited current is substantially the same as the first reference current when the input current is less than the first reference current.

4. The current limiter of claim 1 wherein the limited current is substantially the same as the second reference current when the input current is greater than the second reference current.

5. The current limiter of claim 1 wherein the amplifier includes an operational amplifier.

6. An automatic gain circuit comprising the current limiter of claim 1.

7. An exponential voltage-to-current converter comprising the current limiter of claim 1.

8. A method comprising:
   generating a first reference current and a second reference current;
   receiving the first reference current at an output terminal configured to output a limited current;
   receiving the second reference current at a first input terminal of an amplifier;
   electrically coupling a second input and an amplifier output of the amplifier via a feedback loop;
   receiving an input current at the second input of the amplifier;
   electrically coupling first and second current mirrors between the second input of the amplifier and the output of the amplifier; and
   outputting the limited current such that the first reference current sets a lower limit and the second reference current sets an upper limit.

9. The method of claim 8 wherein the limited current is substantially the same as the input current when the input current is between the first and second reference currents.

10. The method of claim 8 wherein the limited current is substantially the same as the first reference current when the input current is less than the first reference current.

11. The method of claim 8 wherein the limited current is substantially the same as the second reference current when the input current is greater than the second reference current.

12. The method of claim 8 further comprising providing an output current from an exponential current converter as the input current.

13. An exponential voltage-to-current converter circuit comprising:
   an exponential current converter configured to generate an output current that is substantially temperature independent; and a current limiter configured to limit the output current, the current limiter including an amplifier having a first input, a second input, and an amplifier output, the second input and the amplifier output electrically connected via a feedback loop, the second input configured to receive the output current, a first reference-current source electrically coupled to the first input of the amplifier, the first reference-current source configured to generate a first reference current, and first and second current mirrors electrically coupled between the second input of the amplifier and an output terminal, the output terminal outputting the first reference current when the output current is greater than the first reference current.

14. The exponential voltage-to-current converter circuit of claim 13 wherein the current limiter further includes a second reference-current source configured to generate a second reference current, the second reference-current source electrically coupled to the output terminal, the output terminal outputting the second reference current when the output current is less than the second reference current.

15. The exponential voltage-to-current converter circuit of claim 13 further comprising a current multiplier configured to multiply a first current and a current proportional to absolute temperature to generate a second current.

16. The exponential voltage-to-current converter circuit of claim 15 further comprising a voltage scaler configured to receive an input voltage and apply the input voltage to a resistive load to generate the first current.

17. The exponential voltage-to-current converter circuit of claim 15 wherein the exponential current converter applies an exponential transfer function that is dependent on a thermal voltage to the second current to generate the output current.

18. The exponential voltage-to-current converter circuit of claim 17 wherein temperature dependence of the current proportional to absolute temperature counteracts temperature dependence of the thermal voltage to cause the output current to be proportional to a temperature-independent and exponential function of the first current over an operating range.

19. The exponential voltage-to-current converter circuit of claim 18 wherein on a scale of the output current, the operating range is at least 40 dB.

20. An automatic gain control circuit comprising the exponential voltage-to-current converter circuit of claim 13.

* * * * *